(12) United States Patent
Briggs

(10) Patent No.: US 8,863,054 B1
(45) Date of Patent: Oct. 14, 2014

(54) INNOVATIVE VERIFICATION METHODOLOGY FOR DEEPLY EMBEDDED COMPUTATIONAL ELEMENT

(71) Applicant: Marvell International Ltd., Hamilton (BM)

(72) Inventor: Randall Don Briggs, Boise, ID (US)

(73) Assignee: Marvell International, Ltd., Hamilton (BM)

( * ) Notice: Subject to any disclaimer, the term of this patent is extended or adjusted under 35 U.S.C. 154(b) by 0 days.

(21) Appl. No.: 13/693,841

(22) Filed: Dec. 4, 2012

Related U.S. Application Data

(63) Continuation of application No. 11/803,781, filed on May 16, 2007, now Pat. No. 8,332,201.

(60) Provisional application No. 60/808,936, filed on May 26, 2006.

(51) Int. Cl.
*G06F 17/50* (2006.01)
*G06F 11/26* (2006.01)

(52) U.S. Cl.
CPC ..................................... *G06F 11/26* (2013.01)
USPC ........................................... 716/111; 716/101

(58) Field of Classification Search
USPC .................................................. 716/101, 111
See application file for complete search history.

(56) References Cited

U.S. PATENT DOCUMENTS

| 5,437,037 | A | 7/1995 | Furuichi |
| 5,590,135 | A | 12/1996 | Abramovici et al. |
| 5,883,809 | A | 3/1999 | Sullivan et al. |
| 7,013,252 | B1 | 3/2006 | Shih et al. |
| 7,308,631 | B2 * | 12/2007 | McLaurin ..................... 714/726 |
| 7,441,213 | B2 | 10/2008 | Lehner et al. |

* cited by examiner

*Primary Examiner* — Thuan Do

(57) ABSTRACT

A circuit verification method for a logic circuit is presented. The method includes developing a first hardware description language (HDL) code representative of the logic circuit and, for an embedded portion of the logic circuit, developing a second HDL code representative of the embedded portion. The second HDL code includes a process of forcing inputs of the embedded portion to one or more known values. The method further includes operating a processing device in conjunction with the first and second HDL codes and verifying operation of the embedded portion in response to forcing the inputs to the logic circuit.

20 Claims, 5 Drawing Sheets

INNOVATIVE VERIFICATION METHODOLOGY FOR DEEPLY EMBEDDED COMPUTATIONAL ELEMENT

CROSS-REFERENCE TO RELATED APPLICATION

This application is a continuation application of U.S. Non-Provisional application Ser. No. 11/803,781, filed May 16, 2007 (now U.S. Pat. No. 8,332,201), which claims the benefit of U.S. Provisional Application No. 60/808,936, filed May 26, 2006. The contents of U.S. Non-Provisional application Ser. No. 11/803,781 (now U.S. Pat. No. 8,332,201), and U.S. Provisional Application No. 60/808,936 are each incorporated by reference in their entirety.

BACKGROUND

The present invention relates generally to verification of data processing devices. More specifically, the present invention relates to an innovative verification methodology for a deeply embedded computational element.

Various methods and devices have been developed to test logic circuitry which is embedded in an electronic device. Such logic circuitry may include logic elements such as gates and inverters and multiplexers, storage elements such as latches and flip-flops, and more complex elements such as adders and multipliers. All of these devices have inputs for receiving input signals, outputs for providing output signals. The output signal is a function of the input signals and in some cases the previous state of the device.

Testing logic circuitry generally involves verifying the correct operation of the circuitry under a variety of conditions. These conditions include combinations of input signals as well as time-dependent conditions. Under a particular combination of input signals, a certain output signal should result. All possible input and output combinations should be verified for correctness. For circuits for which the output signal is a function of the previous state of the device, all possible input combinations and previous state combinations should be verified.

Some logic circuitry can be prohibitively difficult to test. One example is a deeply embedded computational element within a pipeline circuit. FIG. 1 illustrates a pipeline circuit 100. The pipeline circuit 100 is a functional block implementing a chain of operations. The pipeline circuit 100 includes a plurality of data processing elements 102, 104, 106, 108 connected in series so that the output of one element is the input of the next element. The pipeline circuit 100 has a pipeline input 112 and a pipeline output 114. The data processing elements 102, 104, 106, 108 may be executed in parallel to speed processing. In that case, buffers or other storage may be included between the elements 102, 104, 106, 108 to store intermittent data for the next element. The data processing elements 102, 104, 106, 108 of the pipeline may contain computational elements, such as computational elements 116, 118 of data processing element 104. The location of the computational element 116, 118 within a data processing element 104 that itself is within a pipeline 100 means that the computational element is deeply embedded.

While the exemplary deeply embedded computational element 116, 118 is within a data processing stage of a pipeline circuit 100, the devices and techniques disclosed herein are not limited to this configuration. The devices and techniques also apply to verification of other deeply embedded computation elements, such as a floating point math unit in a central processing unit (CPU).

In a pipeline structure, the outputs of the respective data processing element 102, the inputs and outputs of the respective data processing elements 104, 106, and the inputs of the respective data processing element 108 are generally not available for testing. Neither are the inputs and outputs of the computational element 116, 118 that is located within a data processing element 104 generally available for testing. Conventionally, only inputs to the pipeline and outputs from the pipeline are available. The intermediate signals are not present. Therefore, the operation of each respective data processing element or deeply embedded computational element cannot be readily verified.

One prior solution to the problem of verifying a pipeline structure is to manipulate the input signals to the pipeline block so as to create the desired inputs to the computational block. However, this is difficult and time consuming since the inputs do not directly control the elements. Instead, inputs to the pipeline block pass through many transformations first. Further, if an error condition is detected, it may be difficult to isolate and correct the problem since the erroneous output of the block under test will have passed through data transformations in the pipeline stages that follow it.

A second solution to the problem of verifying a pipeline structure is to multiplex the inputs to the computational elements of the pipeline with an external input. Likewise, an internal output signal of the pipeline can be made available for testing through a multiplexer or other circuit. However, while it may be effective for testing the circuit, this test method adds substantial additional circuitry, which itself can be a source of error and also slows down operation of the pipeline. Since processing speed and throughput are often key features of a pipeline, added circuitry may not be a suitable solution.

SUMMARY

The present invention is defined by the following claims, and nothing in this section should be taken as a limitation on those claims.

A circuit verification method for a logic circuit is presented. In one embodiment, the method includes developing a first hardware description language (HDL) code representative of the logic circuit and, for an embedded portion of the logic circuit, developing a second HDL code for verifying the embedded portion. The second HDL code includes a process of forcing inputs of the embedded portion to one or more known values. The method further includes operating a processing device in conjunction with the first and second HDL codes and verifying operation of the embedded portion in response to forcing the inputs to the logic circuit.

The preferred embodiments will now be described with reference to the attached drawings.

DETAILED DESCRIPTION OF THE PRESENTLY PREFERRED EMBODIMENTS

Figure 1:
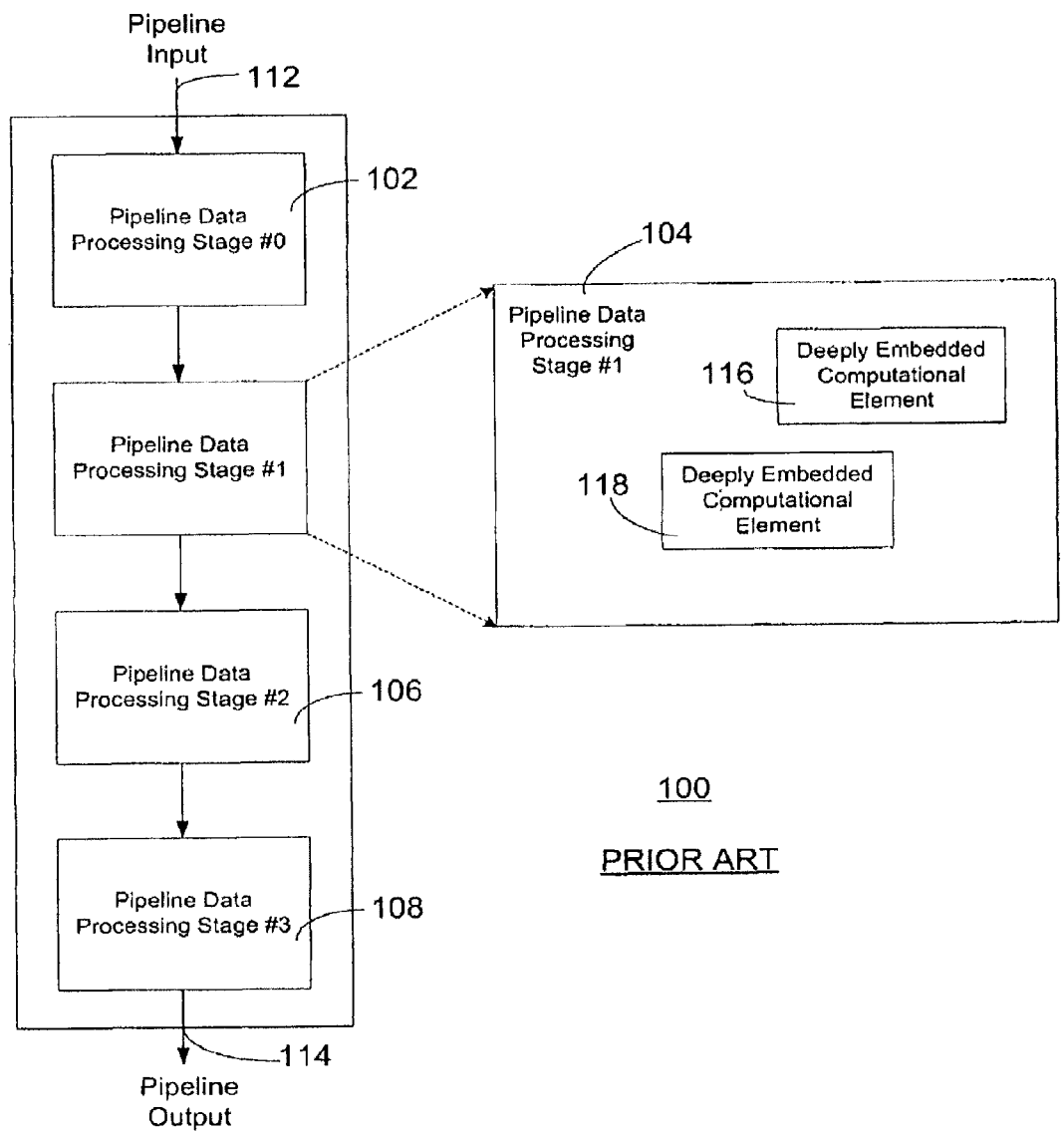
FIG. 1 illustrates a pipeline circuit.
Figure 2:
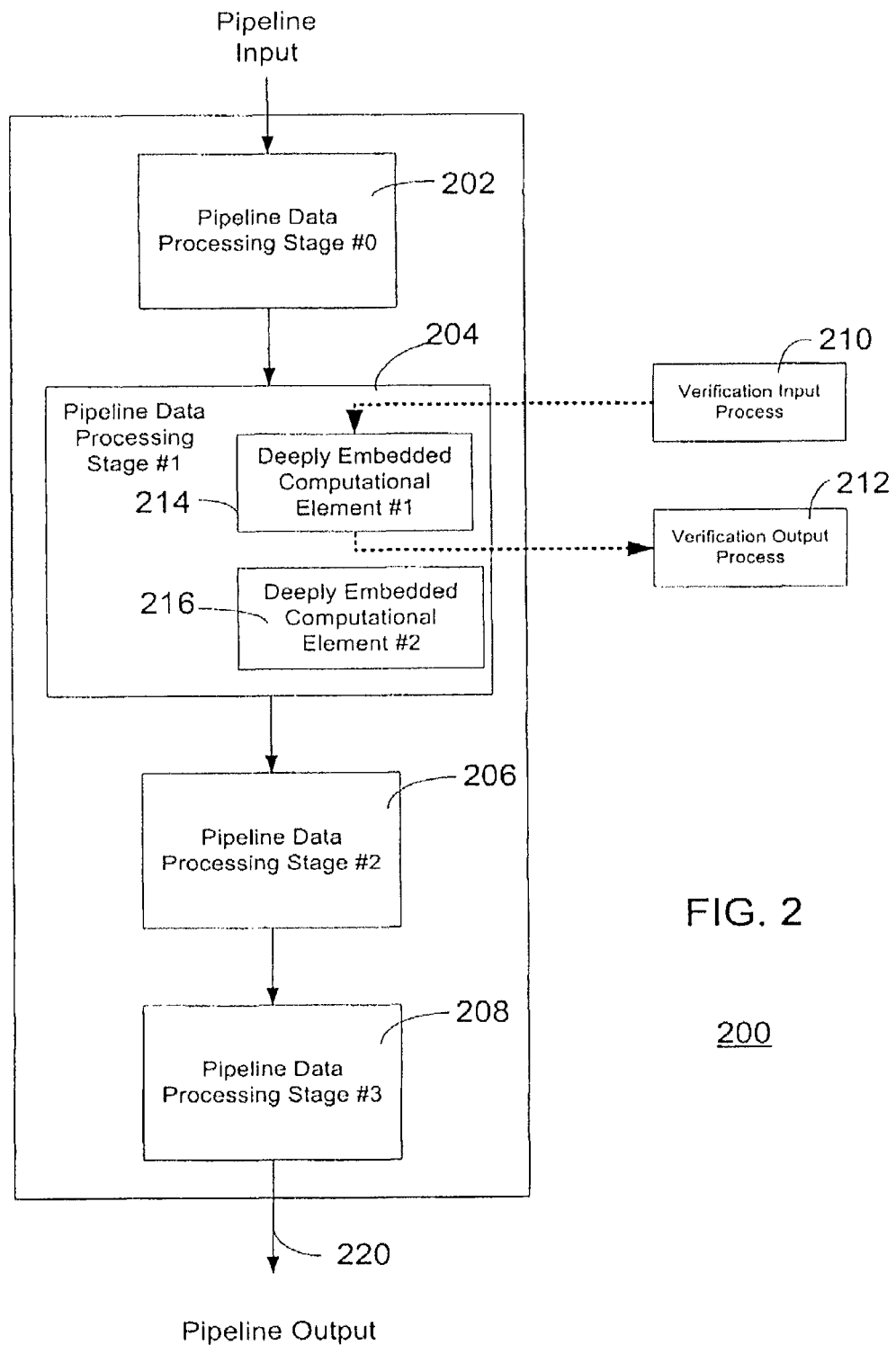
FIG. 2 is a block diagram of a conventional data pipeline circuit with deeply embedded computational elements.

Referring now to FIG. 2, it shows a block diagram of a pipeline circuit 200 with deeply embedded computational elements 214, 216 to be tested. The pipeline circuit 200 in the illustration includes a data pipeline with multiple data processing stages 202, 204, 206, 208, a verification input process 210 and a verification output process 212. The pipeline circuit 200 is intended to be completely general for illustration purposes. The principles described herein may be extended to the widest range of methods and apparatus for simulation, including digital and analog circuits, as well as mixed signal circuits, at any suitable level of abstraction.

The data pipeline circuit 200 implements a chain of operations. The pipeline includes a plurality of data processing elements 202, 204, 206, 208 connected in series so that the output of one element is the input of the next element. The elements 202, 204, 206, 208 of the data pipeline circuit 200 may themselves be other logic blocks, memory, processors or analog functions. The constituent elements 202, 204, 206, 208 of the data pipeline 200 are chosen to provide the desired functionality for the data pipeline 200.

The data pipeline 200 is coupled with an input process 210. The input process 210 provides input signals directly to the deeply embedded computational element 214. These input signals are outputs of the input process 210 and are produced in response to input signals provided to the input process 210. Again, the illustration is intended to be completely general. Any number of input processes may be associated with testing the deeply embedded computational element 204. The input processes may be relatively simple, such as a circuit input node provided directly to the data pipeline 200, or may be very complicated with substantial logic and timing circuitry.

The data pipeline 200 is further coupled with the output process 212. The output process 212 receives as input signals the output signals produced by the deeply embedded computational element 214 being verified. Each respective output process produces an output signal or function in response to the input signal received from the computational element 214 under test.

An embedded block such as the computational element 214 is buried deep within the data processing element 204 of the pipeline circuit 200. It is relatively difficult to verify operation of the deeply embedded computational element 214 using the primary inputs to the pipeline circuit 200. The input signals to the data pipeline 200 may be manipulated so as to create the desired input signals to the deeply embedded computational element 214. With the desired inputs in place the primary output 220 of the data pipeline circuit 200 could be monitored. If the output signal is correct or as-expected, then the deeply embedded computational element 214 may be considered verified for the particular input condition being tested. However, because inputs to the data pipeline 200 may not directly control the input signals to the deeply embedded computational element 214, obtaining the desired inputs may, be time consuming, difficult or even impossible. The outputs of the deeply embedded computational element 214 also must pass through several additional data processing stages before being visible outside of the pipeline circuit 200. If there is an error in the deeply embedded computational element 214, these additional processing stages can easily obscure the exact nature of the failure. The following discussion discloses method and apparatus for testing and verifying an embedded block such as the deeply embedded computational element 214 shown in FIG. 2.

Figure 3:
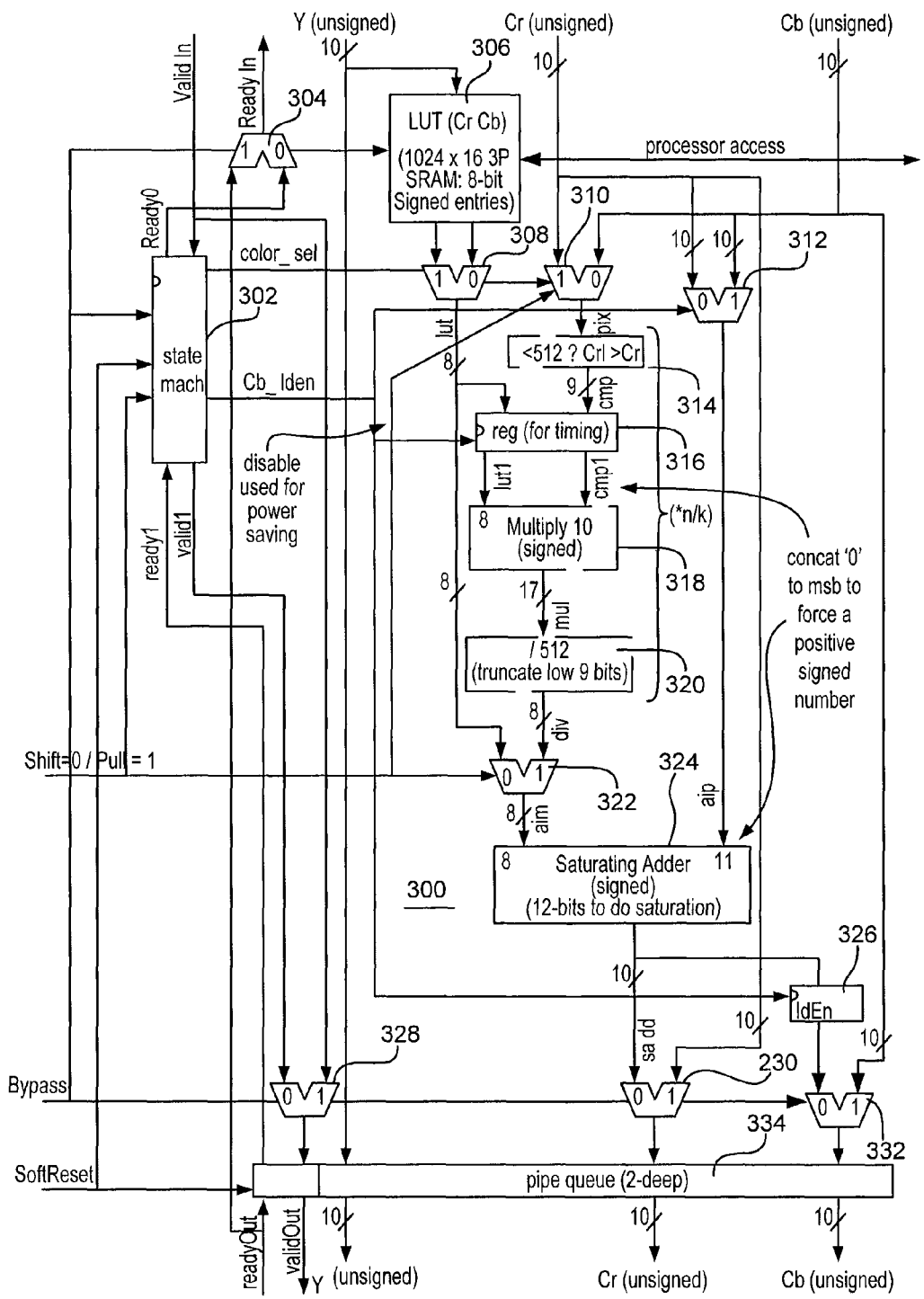
FIG. 3 is a block diagram of a circuit to be tested.

FIG. 3 is a block diagram of a circuit 300 to be tested. The circuit 300 includes a state machine 302, a multiplexer 304, a memory 306, multiplexers 308, 310, 312, a less-than 512 selectable inversion logic 314, a register 316, a multiplier 318, a divider 320, a multiplexer 322, a saturating adder 324, a register 326, multiplexers 328, 330, 332 and a first-in, first-out circuit (FIFO) 334. Verification of the circuit 300 is intended to be exemplary of the techniques described herein.

The circuit 300 of FIG. 3 may be considered a color plane adjust (CPA) circuit for use in a color scanner. The CPA circuit is part of an image correction and enhancement module which improves certain features of a graphical or textual image on a page scanned by a scanner which incorporates the module. When scanning color documents, a scanner produces a signal encoded with RGB color model information. An image correction device makes necessary corrections to the image data and stores the corrected data in memory. The stored data is subsequently passed to an image enhancement device. The image enhancement device is a pipeline and includes a color space conversion data processing stage which converts the image data from RGB color model information to YCbCr color space information. YCbCr image data is then passed to the color plane adjustment data processing stage illustrated in FIG. 3.

The CPA circuit provides correction for data produced when a black and white document is scanned by the color scanner. In such a case, the scanner detects some color erroneously. As a result, the data arriving at the CPA circuit has some color elements which are objectionable. The CPA circuit accordingly removes color information from the data. The YCbCr data is well-adapted to this process. The CPA circuit is followed by several other data processing stages that complete the image enhancement pipeline.

The color plane adjustment circuit of FIG. 3 includes two deeply embedded logic circuits, the less-than 512 selectable inversion circuit 314 and the saturating adder 324. Thus, the input to the less-than 512 circuit 314 must flow through pipeline stages prior to the CPA circuit, and finally through memory 306 and multiplexers 308 and 310 before reaching the less-than 512 selectable inversion circuit 314. The variability of this approach makes reliable verification of the less-than 512 selectable inversion circuit 314 difficult. The inputs to the less-than 512 circuit 314 are not directly available. To set the inputs to a value, the circuitry from the prior pipeline stages as well as the CPA circuitry that precedes the less-than 512 circuit 314 must be considered and its effect on input data analyzed.

The saturating adder 324 faces similar challenges in having its inputs set to desired values to verify its proper function. The saturating adder 324 has a first input provided from multiplexer 322 which may be selected from the pipeline circuit including the less-than 512 circuit 314, the register 316, the multiplier 318 and the divider 320. The saturating adder 324 has a second input coupled to the multiplexer 312 and selected from two of the data inputs to the CPA data processing stage. Again, the inputs to the saturating adder 324 are not directly available for manipulation by a circuit simulator or other test device. The saturating adder 324 has two inputs labeled aim and aip respectively in FIG. 3. Input signal aim is an 8-bit value and input signal aip is an 11-bit value in this example. The input value aim is selected by multiplexer 322 between the output signal from multiplexer 308 and the output of the divider 320. The output signal from the multiplexer 308, in turn, is selected from two signals produced by the memory 306.

The circuit 300 may be modeled using a software code. Various modeling techniques are available, but one effective modeling technique uses hardware description language (HDL). HDL permits formal description of electronic circuits. It can describe the operation and design of the circuit. HDL can also control tests to verify the circuit's operation by means of simulation. HDL provides a standard text-based expression of the temporal behavior and/or spatial circuit structure of an electronic system. HDL syntax and semantics include explicit notations for expressing time and concurrency which are the primary attributes of hardware. One example of a suitable HDL is Verilog.

Essential to HDL design is the ability to simulate HDL programs. An HDL program may be tested using a program called simulator. The simulator maintains a resettable "clock", similar to the real clock of a digital device, and allows the designer to print out the values of various registers over time in order to debug the code. The simulator may be run in conjunction with a data processing system such as a personal computer.

An example of Verilog computer program code that may be used to test the circuit 300 of FIG. 3 is shown below.

```
//////////////////////////////////////////////////
'include "cpa_reg_defines.h"
//////////////////////////////////////////////////
'define CBI_I tb_top.CBI_I0
'define CBI_T tb_top.CBI_T0
'define CPA_PATH tb_top.CPA
task cycle_adder (input reg signed [7:0] A,
    input reg signed [10:0] B,
    input reg[9:0] C);
begin
force tb_top.CPA.aim=A;
force tb_top.CPA.aip=B;
@(posedge Clk);
if (tb_top.CPA.sadd !=C)
$display("ERROR: exp:% d act:% d at time % t\n", c,
tb_top.CPA.sadd,$time);
@(posedge Clk);
release tb_top.CPA.aim;
release tb_top.CPA.aip;
end endtask
initial
begin
@(posedge nReset);
waitCycles(10);
//-------------------------
//test the saturating adder
//adder A input: max:127 min:–128
//adder B input: max: 1023 min:–1024
//adder output: max:1023 min:0
//-------------------------
$display("Testing Saturating Adder\n");
cycle_adder (8'sd022, 11'd033, 10'd055); //simple
cycle_adder (8'sd123, 11'd321, 10'd444); //simple
cycle_adder (8'sd1, 11'd1021, 10'd1022); //one less than
    max
cycle_adder (8'sd2, 11'd1021, 10'd1023); //max
cycle_adder (8'sd3, 11'd1021, 10'd1023); //saturated, max
    value now
cycle_adder (8'sd127, 11' d1023, 10'd1023); //super-satu-
    rated, max value now
cycle_adder(8'sd3, 11'd1023, 10'd1020); //try a negative
    number
cycle_adder(8'sd128,11'd129, 10'd1); //one more than min
cycle_adder (8'sd128, 11'd128, 10'd0); //min
cycle_adder (8'sd128, 11'd127, 10'd0); //saturated, min
    value now
cycle_adder (8'sd0, 11'd0, 10' d0); //saturated, min value
    now
cycle_adder (8' sd1, 11'd0, 10'd0); //saturated, min value
    now
```
$display("Ending Simulation @% 0t\n", $time);
$finish;
end In particular, the portion of the computer program code beginning at "task cycle_adder" defines a Verilog task or subroutine for verifying operation of the saturating adder 324 of FIG. 3. Variable values may be passed to the subroutine. This task has three inputs: an 8 bit signed variable A, an 11 bit signed variable B and a 10 bit unsigned variable C. For simulating the operation of the saturating adder 324, the variable A corresponds to the first input, labeled aim in FIG. 3, the variable B corresponds to the second input, labeled aip in FIG. 3, and the variable C corresponds to an expected value C, labeled sadd in FIG. 3. The saturating adder 324 adds the values at the inputs aim and aip. However, if the sum exceeds the maximum value of the adder (1023 in the illustrated case), the output value is limited to the maximum value. If the sum is less than zero, the output value is limited to zero. Using the methodology for verification of deeply embedded computation elements, described herein, provides a convenient means to verify that the saturation feature of the adder is working correctly.

The computer program code illustrated above makes use of a feature provided by some hardware design languages to set an internal node to a predetermined value. The Verilog code above includes the command:

force tb_top.CPA.aim=A;

Verilog includes a command called "force" which temporarily fixes the specified circuit node to the specified value during a circuit simulation. In this example, the input aim is forced to the input value A passed to the subroutine. Forcing the inputs of a portion of circuit such as the saturating adder causes the inputs to be assigned to the forced values. This forcing occurs independently of other operation of the simulation. Thus, if the simulation is operating on a processing system and the operation of the total circuit drives the node aim to a value of 12, for example, when the force command is used as shown above and the variable A has the logical value of 23, the input to the adder aim will have the value 23. The simulated value aim driven by multiplexer 322 is ignored in favor of the forced value.

Similarly, the Verilog code above includes the command force tb_top.CPA.aip=B;

This command operates to force the second input, aip, of the saturating adder to the value of the input variable B. Regardless of the simulated value of the input aip produced by the Verilog simulation, the force command sets the input to the same value as passed to the subroutine in the variable B.

In the exemplary software code above, the two "force" commands are followed by a synchronizing command:

@ (posedge Clk);

This allows time to pass in the simulation and for the forced inputs A and B to propagate through saturating adder 324.

The output signal of the saturating adder is then tested by comparing the result produced by the adder with an expected output value. The expected value is passed to the subroutine "task cycle_adder" as variable C. When the subroutine is called, each of variables A, B and C are specified in the subroutine call. In the circuit diagram of FIG. 3, it can be seen that the output of the saturating adder is labeled sadd. Thus, the subroutine makes a comparison set by the command if (tb_top.CPA.sadd !=C)
$display("ERROR: exp:% d act:% d at time % t\n",
C, tb_top.CPA.sadd,$time);

That is, if the value of output sadd is not equal to the value of C, the software code calls for the display of an error message along with identifying information such as the clock time at which the error occurred. If an error occurs, the error message may be used to debug the design of the saturating adder. If no error occurs, the design of the saturating adder may be considered verified.

After testing the output value of the adder against the expected value, the software code above releases the nodes which had previously been forced to the test values.

release tb_top.CPA.aim;
release tb_top.CPA.aip;

In Verilog, the release command is a counterpart to the force command and generally follows use of the force command. Whereas the force command caused a signal on a node to have the specified value without regard to the operation of the remainder of the circuit, the release command takes away the "forcing" function and allows the signal value to go to its value as set by the remainder of the circuit.

Following definition of the subroutine which verifies the operation of the saturating adder above are several exemplary calls to that subroutine. The subroutine calls are in the form cycle_adder(A, B, C), where A and B are the addends to the saturating adder, corresponding to inputs labeled aim and aip in FIG. 3. C is the expected output value to be compared with the output value produced by the modeled saturating adder.

As indicated in the software code above, the maximum permitted value for outputs from this adder is 1023; the minimum permitted value is 0. Any value outside this range is an error. Any value that does not match the expected value is an error.

Thus in the first test example, a subroutine call is specified:
cycle_adder(8'sd022, 11'd033, 10'd055);

Input aim is provided with the value 22; input aip is provided with the value 33. The expected output value is 55. In a second example, the following subroutine call is specified:
cycle_adder(8'sd123, 11'd321, 10'd444);

In this example, input aim is set to 123 and input aip is set to 321, with the expected result specified as 444. The next several examples verify values around the critical function of saturation. The first test example is
cycle_adder(8'sd1, 11'd1021, 10'd1022);

In this test example, adding 1 and 1021 should produce a value one less than the maximum permitted value. The second test example is
cycle_adder(8'sd2, 11'd1021,10'd1023);

In this test example, adding 1 to 1021 produces 1023, which is the maximum permitted value. The third test example is
cycle_adder(8'sd3, 11'd1021, 10'd1023);

In this test example, adding 3 to 1021 produces 1024. However, the saturating adder should saturate at the maximum permitted value, 1023, which is the value passed to the subroutine in the variable C. The next test example is
cycle_adder(-8'sd127, 11'd1023, 10'd1023);

In this example, the saturating adder is "super saturated," meaning the input values are set to their maximum value. Again, the maximum permitted value of 1023 is passed in the variable C to be compared with the value produced by the saturating adder.

The next several test examples verify operation of the saturating adder when passed negative values as inputs. The next test example is
cycle_adder(-8'sd3, 11'd1023, 10'd1020);

Here, the input aim is set to the value −3 and the input aip is set to the value 1023. The expected result is set to the value 1020. The next test example is
cycle_adder(-8'sd128, 11'd129, 10'd1);

In this test example, the input aim is set to −128 and input aip is set to 129. The expected output value is 1, or one more than the minimum permitted value to be output from the saturating adder. In the next test example,
cycle_adder(-8'sd128, 11'd 128, 10'd0);

input aim is set to the value −128 and input aip is set to the value 128. The expected result is 0. This tests the accuracy of the saturating adder to produce the minimum permitted value. In the next test example,
cycle_adder(-8'sd128, 11'd127, 10'd0);

the input aim is set to −128 and the input aip is set to 127. The correct value is −1 but that exceeds the minimum permitted value of 0, so the expected output value is set to 0, the saturated value. In the next example,
cycle_adder(8'sd0, 11'd0, 10'd0);

0 and 0 are added at inputs aim and aip and an expected value of 0 is tested. In the final example above,
cycle_adder(-8'sd 1, 11'd0, 10'd0);

−1 and 0 are added at inputs aim and aip and an expected saturated value of 0 is tested.

The saturating adder of FIG. 3 and the software test code above are intended to be exemplary only. Other deeply embedded circuits, such as the less-than 512 circuit 314 of FIG. 3, may be tested in accordance with this method. The test examples for other such circuits will be tailored to match the performance or design requirements of such circuits. For example, the saturating adder of the above example had a design requirement of accurate addition of two input values plus saturation of the output at the maximum permitted value or the minimum permitted value. The test examples were chosen to test operation of the saturation adder around these design requirements.

Figure 4:
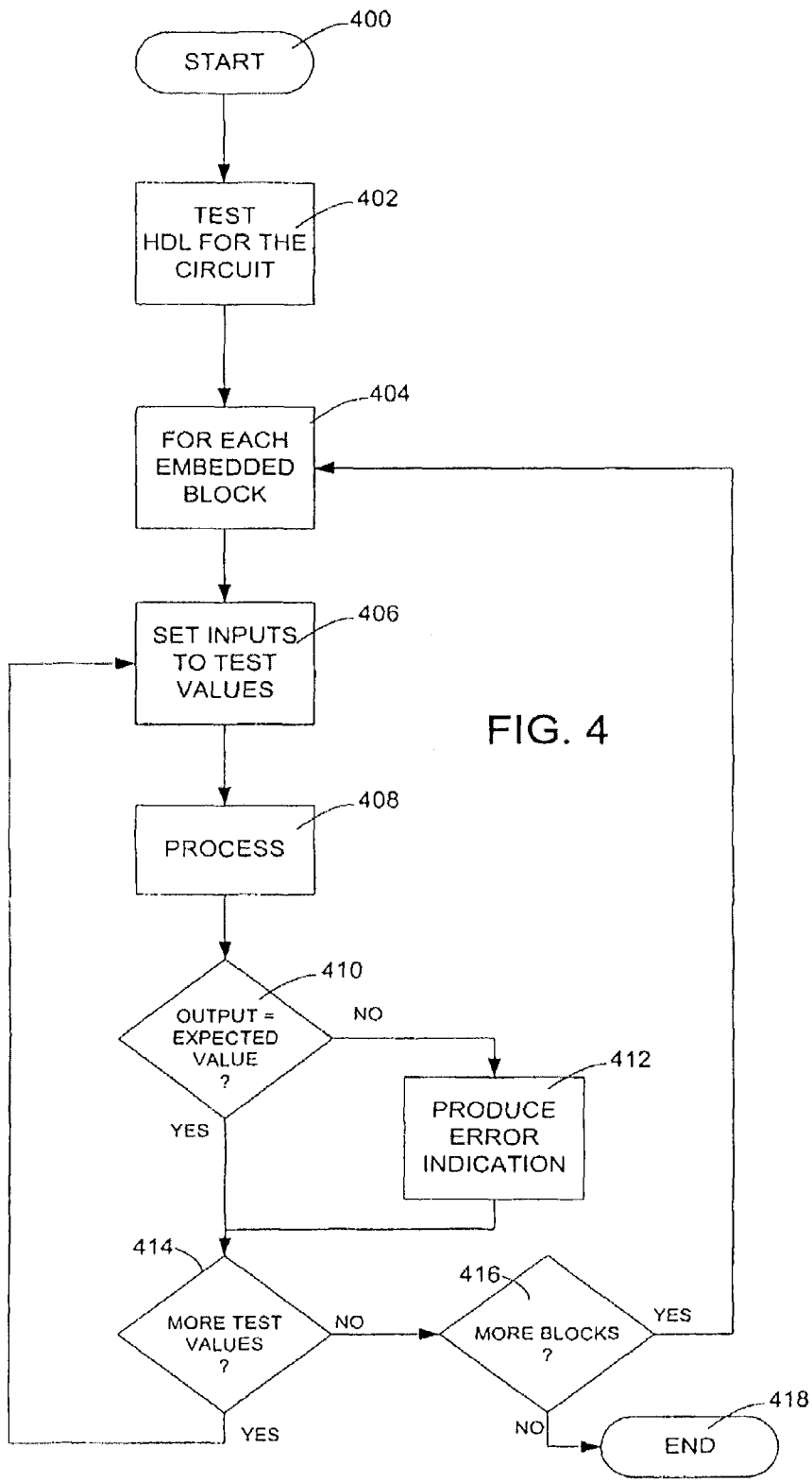
FIG. 4 is a flow diagram illustrating a verification method for a circuit including a deeply embedded computational element or block.

FIG. 4 is a flow diagram illustrating a verification method for a circuit including a deeply embedded computational element or block. The method begins at block 400. At block 402, the hardware description language for the circuit is tested. The circuit is simulated using HDL such as Verilog.

Following verification of the overall circuit operation, individual blocks may be verified. In particular, deeply embedded blocks having inputs and/or outputs which are not directly accessible in the circuit simulation need to be verified for correct operation. Thus in FIG. 4, a looping operation begins at block 404 in which each such embedded block is selected for analysis. At block 406, one or more inputs to the selected embedded block are set to test values. In an example using Verilog hardware design language, the "force" function may be used to establish input nodes at selected values independent of other processing in the circuit. The simulation is then processed, block 408.

At block 410, the output value from the simulation is compared with an expected value. If the expected value and the simulated value do not match, at block 412, an error indication is produced. Otherwise, at block 414, it is determined if there are more test values. The number of test values may be determined in any suitable manner. In some examples, the test values may be chosen to verify particular design features or goals of the embedded circuit block. In other examples, all possible test values may be processed to confirm operation.

If there are more test values, control returns to block 406 where the inputs are set to the new test values. The loop including blocks 406,408,410,412 and 414 continues until all test values have been processed. At block 416, it is determined if there are more embedded blocks to test. If so, control returns to block 404 and the process of testing the embedded block using predetermined test values begins for the new block. Otherwise, the method ends at block 418.

Figure 5:
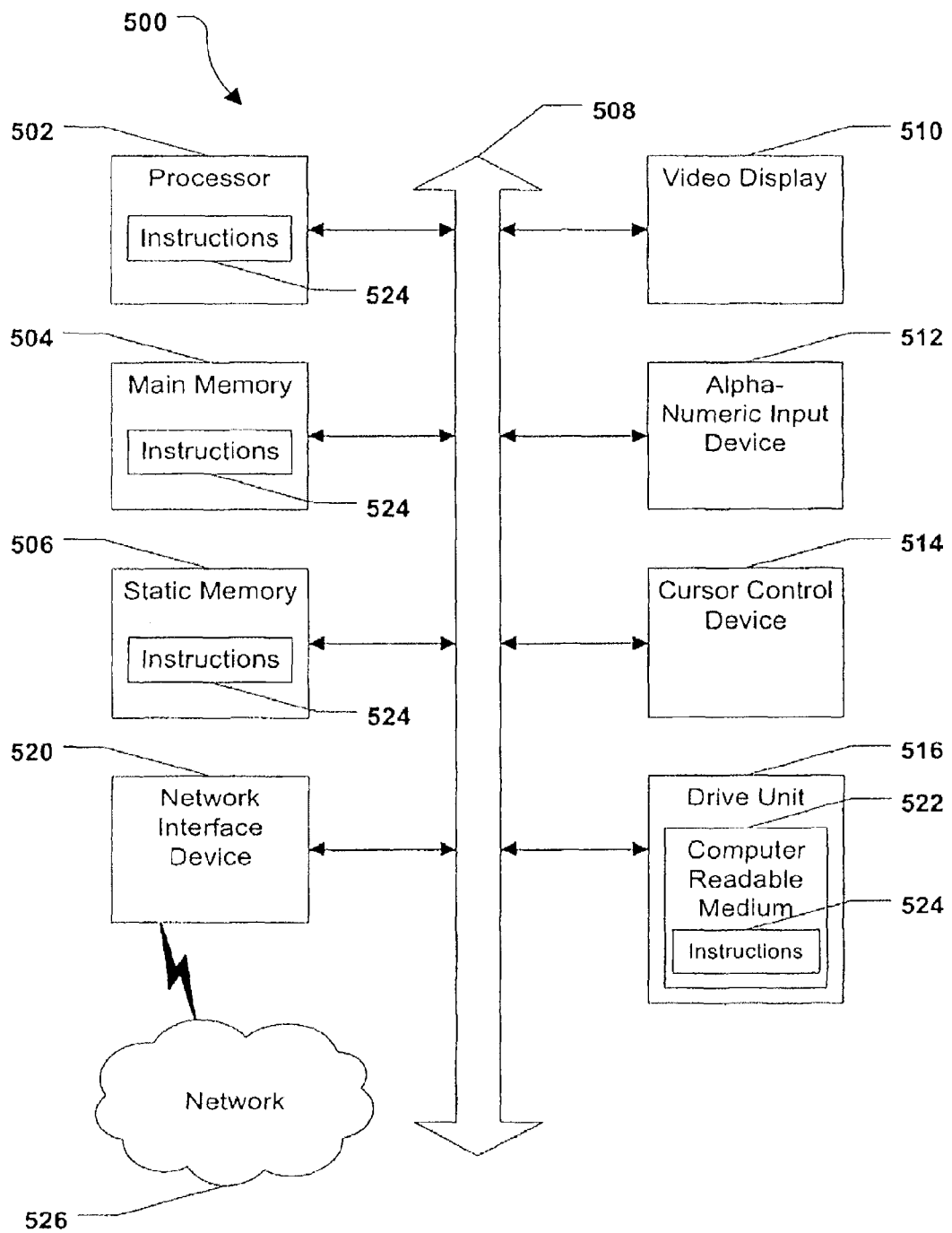
FIG. 5 is a block diagram of a data processing system.

Referring to FIG. 5, an illustrative embodiment of a general computer system is shown and is designated 500. This computer system 500 is suitable for performing the simulations described herein to verify operation of a logic circuit including one or more deeply embedded computational elements. To that end, the computer system 500 may operate in conjunction with software program codes such as hardware description language. Verilog HDL is an example of one such hardware description language.

The computer system 500 can include a set of instructions that can be executed to cause the computer system 500 to perform any one or more of the methods or computer based functions disclosed herein. The computer system 500 may operate as a standalone device or may be connected, e.g., using a network, to other computer systems or peripheral devices.

In a networked deployment, the computer system may operate in the capacity of a server or as a client user computer in a server-client user network environment, or as a peer computer system in a peer-to-peer (or distributed) network environment. The computer system 500 can also be implemented as or incorporated into various devices, such as a personal computer (PC), a tablet PC, a set-top box (STB), a personal digital assistant (PDA), a mobile device, a palmtop computer, a laptop computer, a desktop computer, or any other machine capable of executing a set of instructions (sequential or otherwise) that specify actions to be taken by that machine. In a particular embodiment, the computer system 500 can be implemented using electronic devices that provide voice, video or data communication. Further, while a single computer system 500 is illustrated, the term "system" shall also be taken to include any collection of systems or subsystems that individually or jointly execute a set, or multiple sets, of instructions to perform one or more computer functions.

As illustrated in FIG. 5, the computer system 500 may include a processor 502, e.g., a central processing unit (CPU), a graphics processing unit (GPU), or both. Moreover, the computer system 500 can include a main memory 504 and a static memory 506 that can communicate with each other via a bus 508. As shown, the computer system 500 may further include a video display unit 510, such as a liquid crystal display (LCD), an organic light emitting diode (OLED), a flat panel display, a solid state display, or a cathode ray tube (CRT). Additionally, the computer system 500 may include an input device 512, such as a keyboard, and a cursor control device 514, such as a mouse. The computer system 500 can also include a disk drive unit 516, and a network interface device 520.

In a particular embodiment, as depicted in FIG. 5, the disk drive unit 516 may include a computer-readable medium 522 in which one or more sets of instructions 524, e.g. software, can be embedded. Further, the instructions 524 may embody one or more of the methods or logic as described herein. In a particular embodiment, the instructions 524 may reside completely, or at least partially, within the main memory 504, the static memory 506, and/or within the processor 502 during execution by the computer system 500. The main memory 504 and the processor 502 also may include computer-readable media.

In an alternative embodiment, dedicated hardware implementations, such as application specific integrated circuits, programmable logic arrays and other hardware devices, can be constructed to implement an HDL simulator accelerator that perform one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions 524 or receives and executes instructions 524 responsive to a propagated signal, so that a device connected to a network 526 can communicate voice, video or data over the network 526. Further, the instructions 524 may be transmitted or received over the network 526 via the network interface device 520.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

It is intended that the foregoing detailed description be understood as an illustration of selected forms that the invention can take and not as a definition of the invention. It is only the following claims, including all equivalents, that are intended to define the scope of this invention.

What is claimed is:

1. A circuit verification method for a deeply embedded portion of a logic pipeline circuit, the method comprising:

for the deeply embedded portion of the logic pipeline circuit, the deeply embedded portion comprising one or more inputs that are directly inaccessible to an external processing device executing a first computer code to simulate operation of the logic pipeline circuit, the external processing device being external to the logic pipeline circuit, executing, with the external processing device, a second computer code to simulate operation of the deeply embedded portion, the external processing device having direct access to the one or more inputs of the deeply embedded portion when executing the second computer code;

directly forcing, with the external processing device executing the second computer code, the one or more inputs of the deeply embedded portion to one or more known values;

receiving, by the external processing device, an output signal from the deeply embedded portion of the logic pipeline circuit, the output signal being based on the one or more inputs forced to the one or more known values; and verifying, with the external processing device, operation of the deeply embedded portion based on a comparison of the received output signal and an expected value, the expected value being a value that the deeply embedded portion is expected to output in response to directly forcing the one more inputs to the one or more known values.

2. The circuit verification method of claim 1 further comprising:

after verifying the operation of the deeply embedded portion, releasing the one or more inputs of the deeply embedded portion.

3. The circuit verification method of claim 2 wherein directly forcing the one or more inputs of the deeply embedded portion to the one or more known values causes the one or more inputs to be logically assigned to the one or more known values independent of one or more values being output to the one or more inputs when the external processing device executes the first computer code to simulate operation of the logic pipeline circuit, and wherein releasing the one or more inputs of the deeply embedded portion allows the one or more values to be applied to the one or more inputs when the external processing device executes the first computer code.

4. The circuit verification method of claim 1, wherein directly forcing the one or more inputs comprises:

setting a first input of the one or more inputs of the deeply embedded portion to a first critical value using the second computer code;

setting a second input of the one or more inputs of the deeply embedded portion to a second critical value; and further comprising comparing a result generated by the deeply embedded portion based on the first critical value and the second critical value with the expected value.

5. The circuit verification method of claim 4, further comprising:

generating, with the external processing device, an error indication in response to a mismatch between the result and the expected value.

6. The circuit verification method of claim 1, wherein the logic pipeline circuit comprises a color plane adjust circuit, and wherein the deeply embedded portion comprises one of a less-than selectable inversion circuit or a saturating adder.

7. A circuit verification method for a deeply embedded portion of a logic pipeline circuit, the method comprising:

for the deeply embedded portion of the logic pipeline circuit, the deeply embedded portion comprising one or more inputs that are directly inaccessible to an external processing device operating a first simulator to simulate of the logic pipeline circuit, the external processing device being external to the logic pipeline circuit, operating, with the external processing device, a second simulator, to simulate operation of the deeply embedded portion, the external processing device having direct access to the one or more inputs when operating the second simulator;

directly forcing, with the external processing device operating the second simulator, the one or more inputs of the deeply embedded portion to one or more test values;

determining, with the external processing device, whether an output value of the deeply embedded portion matches an expected value, the output value being based on the one or more inputs forced to the one or more test values; and generating, with the external processing device, an error indication in response to a mismatch between the output value and the expected value, the expected value being a value that the deeply embedded portion is expected to output in response to directly forcing the one or more inputs to the one or more test values.

8. The circuit verification method of claim 7, further comprising:

operating, with the external processing device, the first simulator, wherein the first simulator comprises a hardware description language code that models the logic pipeline circuit.

9. The circuit verification method of claim 8, wherein the hardware description language code is arranged to simulate performance of the logic pipeline circuit in response to specified input values to the logic pipeline circuit that produce output values indicative of the output of the logic pipeline circuit.

10. The circuit verification method of claim 7, wherein directly forcing the one or more inputs to the one or more test values comprises:

setting the one or more inputs of the deeply embedded portion to the one or more test values with the second simulator independent of one or more values generated at the one or more inputs of the deeply embedded portion by operation of the first simulator.

11. The circuit verification method of claim 7 wherein operating the second simulator comprises:

calling one or more subroutines that model the deeply embedded portion of the logic pipeline circuit; and passing the one or more test values to the one or more subroutines for use in modeling the deeply embedded portion.

12. The circuit verification method of claim 11 wherein operating the second simulator further comprises:

passing the expected value to the one or more subroutines.

13. The circuit verification method of claim 7, wherein the logic pipeline circuit comprises a color plane adjust circuit, and wherein the deeply embedded portion comprises one of a less-than selectable inversion circuit or a saturating adder.

14. A circuit simulator external to a logic pipeline circuit, the circuit simulator comprising:

a processor; and a memory in communication with the processor, the memory configured to store:

a first computer code of executable by the processor to simulate a logic pipeline circuit, the logic pipeline circuit having a deeply embedded portion comprising one or more inputs that are directly inaccessible to the processor when executing the first computer code; and a second computer code executable by the processor, the processor having direct access to the one or more inputs of the deeply embedded portion when executing the second computer code; and wherein the processor is configured to:

directly force the one or more inputs of the deeply embedded portion to one or more known values upon execution of the second computer code;

receive an output signal from the deeply embedded portion of the logic pipeline circuit, the output signal being based on the one or more inputs forced to the one or more known values; and verify operation of the deeply embedded portion based on a comparison of the received output signal and an expected value, the expected value being a value that the deeply embedded portion is expected to output in response to directly forcing the one or more inputs to the one or more known values.

15. The circuit simulator of claim 14, wherein the processor is further configured to:

release the one or more inputs of the deeply embedded portion after verification of the operation of the deeply embedded portion.

16. The circuit simulator of claim 15, wherein the processor is configured to directly force the one or more inputs of the deeply embedded portion to the one or more known values independent of one or more values generated at the one or more inputs through execution of the first computer code, and wherein in response to release of the one or more inputs, the one or more inputs are set to the one or more values generated through execution of the first computer code.

17. The circuit simulator of claim 14, wherein the processor is configured to directly force the one or more inputs by:

setting a first input of the one or more inputs of the deeply embedded portion to a first critical value using the second computer code;

setting a second input of the one or more inputs of the deeply embedded portion to a second critical value; and wherein the processor is further configured to: compare a result generated by the deeply embedded portion based on the first critical value and the second critical value with the expected value.

18. The circuit simulator of claim 17, wherein the processor is further configured to:

generate an error indication in response to a mismatch between the result and the expected value.

19. The circuit simulator of claim 14, wherein the second computer code comprises a portion of the first computer code.

20. The circuit simulator of claim 14, wherein the logic pipeline circuit comprises a color plane adjust circuit, and wherein the deeply embedded portion comprises one of a less-than selectable inversion circuit or a saturating adder.

\* \* \* \* \*